United States Patent
Collins et al.

(10) Patent No.: US 7,518,240 B2
(45) Date of Patent: Apr. 14, 2009

(54) DEPOSITION PATTERN FOR ELIMINATING BACKSIDE METAL PEELING DURING DIE SEPARATION IN SEMICONDUCTOR DEVICE FABRICATION

(75) Inventors: Douglas Collins, Albuquerque, NM (US); Linlin Liu, Hillsborough, NJ (US); Elaine Taylor, Albuquerque, NM (US)

(73) Assignee: Emcore Corporation, Albuquerque, NM (US)

( * ) Notice: Subject to any disclaimer, the term of this patent is extended or adjusted under 35 U.S.C. 154(b) by 259 days.

(21) Appl. No.: 11/728,751

(22) Filed: Mar. 27, 2007

(65) Prior Publication Data

US 2007/0202665 A1 Aug. 30, 2007

Related U.S. Application Data

(62) Division of application No. 11/280,783, filed on Nov. 16, 2005, now Pat. No. 7,198,988.

(51) Int. Cl.
*H01L 23/48* (2006.01)

(52) U.S. Cl. ............................. 257/734; 257/E23.178
(58) Field of Classification Search ......... 257/734–736, 257/E23.178
See application file for complete search history.

(56) References Cited

U.S. PATENT DOCUMENTS

| 6,339,256 B2* | 1/2002 | Akram ................... 257/691 |
| 6,908,784 B1* | 6/2005 | Farnworth et al. ......... 438/106 |
| 2005/0282360 A1* | 12/2005 | Kida et al. ................ 438/462 |

* cited by examiner

*Primary Examiner*—Brook Kebede

(57) ABSTRACT

A semiconductor wafer that includes a plurality of groups of active devices or circuits on a first side of the wafer and a patterned electrical contact on the backside of the wafer. Each group consisting of an active device or circuit is intended to be diced into a discrete chip. The backside of the wafer includes a metal layer patterned into discrete spaced-apart deposits that form an electrical contact to the semiconductor and the respective group of active devices. The deposits are not contiguously or laterally connected to each other and function to protect the metal layer from peeling or detaching from the wafer during dicing of the semiconductor wafer into chips.

12 Claims, 3 Drawing Sheets

DEPOSITION PATTERN FOR ELIMINATING BACKSIDE METAL PEELING DURING DIE SEPARATION IN SEMICONDUCTOR DEVICE FABRICATION

REFERENCE TO RELATED APPLICATIONS

This application is a Divisional of U.S. application Ser. No. 11/280,783 filed Nov. 16, 2005 (now U.S. Pat. No. 7,198,988).

FIELD OF THE INVENTION

The field of the invention relates to the fabrication of semiconductor wafers and more particularly to quality and reliability associated with the dicing of fabricated semiconductor wafers.

BACKGROUND OF THE INVENTION

Integrated circuits are typically fabricated on a wafer of silicon or other appropriate semiconductor. After fabrication of a wafer, the individual chips are separated from the wafer and packaged and interconnected with other circuits in their final application, such as for computers, consumer electronics, etc.

In order to function as intended, the chips of integrated circuits are provided with external electrical connections for use with other circuits. In some designs, certain of the external connections are typically formed by plating metal pads on the bottom (backside) of the wafer.

When the die are separated, the backside metal (BM) must be separated along with the semiconductor chips. Typical die separation techniques involve sawing or scribe and break. These techniques involve either grinding away or cleaving the semiconductor wafer to separate the die.

The results of these separation techniques are sensitive to the mechanical properties of the material being separated. Because semiconductors tend to be hard and brittle, while the metal (e.g., Au/Ge—NI—Au) of the connections is soft and ductile, the BM layer is often damaged (e.g., torn, delaminated, etc.) when the die are separated.

Scribing and breaking wafers often causes the BM layer to tear across a break line. Sawing often causes small chips to be dislodged adjacent the saw kerf, thereby loosening the edges of the BM layer adjacent the saw kerf.

Wafers are generally mounted on adhesive tape (saw frames) before die separation. After separation, the die are then removed from (i.e., picked off) the tape and either placed in their final package or in an intermediate carrier. As the die are removed from the adhesive, the damaged edges adhere to the tape, peel off the die and/or form burrs.

The metal burrs on the bottom of the die cause misalignment during use by causing the die to rest at an angle when placed on a flat surface. When placed into a final package the misalignment of the top surface of the die can degrade the performance of devices optically connected with the die.

In addition, the tilted die degrades the quality of wire bonds and reduces the ability of the package to extract heat from active devices. Both conditions can cause long-term quality and reliability concerns.

Peeled metal and tilted die can reduce the electrical contact area thereby increasing die electrical resistance. Because the tearing process is inherently random, tearing contributes to process variability in integrated circuit production and use.

In addition, the trend towards smaller die increases the variability caused by torn and/or delaminated metal. For example, for any given metal burr height, a smaller die width will cause a larger tilt angle. For a given area of torn metal, the smaller die will also result in a greater percentage of total area being damaged.

As die sizes shrink, the tackiness of the tape used during dicing must also be increased to keep the die attached to the tape during dicing. The increased tackiness increases the incidence of damage. Consequently, a need exists for a methods and apparatus for reducing the incidence of damaged electrical contacts during the separation process.

SUMMARY

A method of protecting metal traces and contacts on a fabricated semiconductor wafer from mechanical damage during dicing of the fabricated wafer, where the metal traces and contacts form electrical connections with an active device region of the semiconductor. The method includes the steps of providing a group of discrete metal deposits adjacent the metal traces and contacts, wherein said metal deposits are substantially not contiguously connected to each other or to any traces or contacts of the active device regions of semiconductor die, attaching the fabricated wafer to an adhesive tape used for securing the fabricated wafer during a die separation process, separating the die from the fabricated wafer while attached to the adhesive tape and removing the die from the adhesive tape.

DETAILED DESCRIPTION OF AN ILLUSTRATED EMBODIMENT

Figure 1:
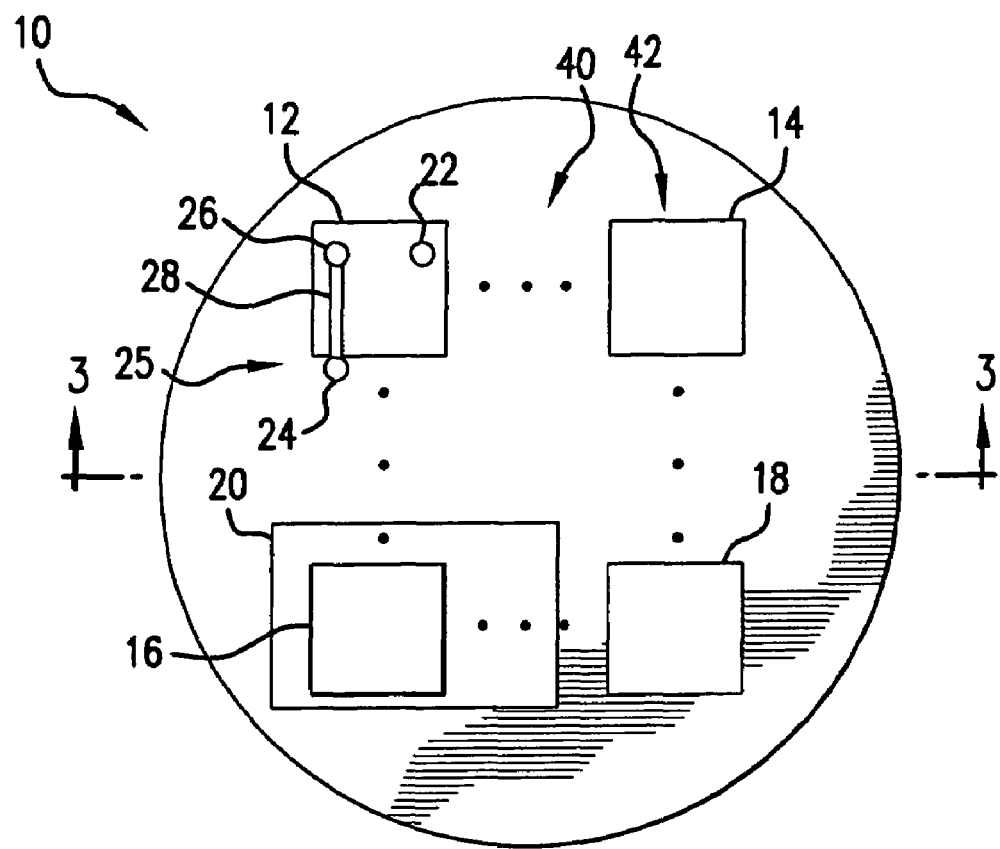
FIG. 1 depicts a top plan view of a wafer shown in accordance with an illustrated embodiment of the invention.

FIG. 1 is a bottom view of a fabricated wafer 10 under illustrated embodiments of the invention. A fabricated wafer is a wafer upon which a number of integrated circuits have been constructed by conventional techniques (except as noted below) and which wafer needs to be separated into one or more die in order to serve its intended function.

Under illustrated embodiments, the wafer 10 may be fabricated with a group of metal deposits (dots) 40, 42 on a backside of the wafer 10. The backside of the wafer is the side of the wafer that would be attached to the adhesive of a saw frame during a separation process.

Figure 5:
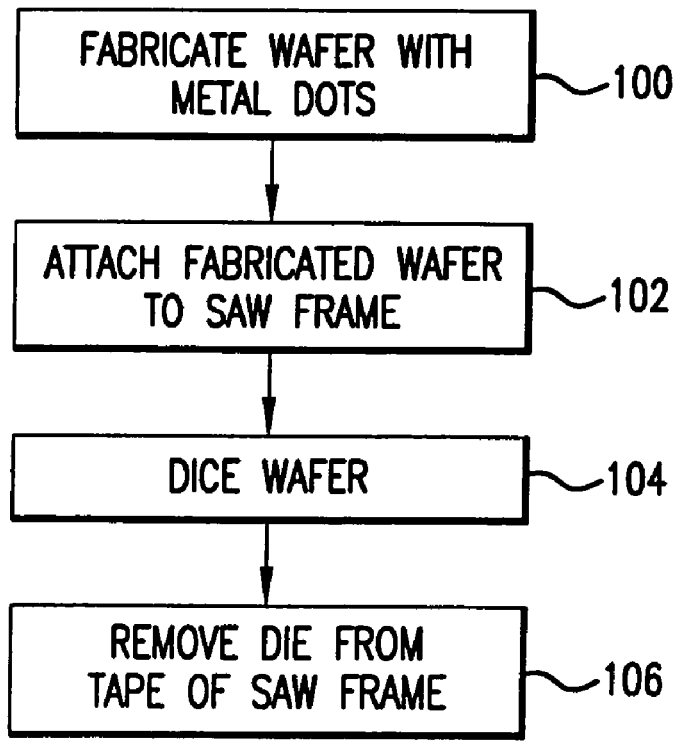
FIG. 5 depicts method steps that may be used in conjunction with processing the wafer of FIG. 1.

The group of metal dots may be disposed adjacent to and around any metal structure disposed on the backside of the wafer 10. The presence of the metal dots has been found to retard the occurrence of burrs on backside metal structures especially adjacent a saw kerf. FIG. 5 is a flow chart that depicts process steps that may be used in conjunction with the metal dots to reduce the occurrence of burrs in accordance with one illustrated embodiment of the invention.

Included within the wafer 10 may be any of a number of integrated circuits 12, 14, 16, 18 (shown in outline). The integrated circuits 12, 14, 16, 18 will be referred to as chips even though they are shown as part of the wafer 10 in FIGS. 1 and 2.

Figure 4:
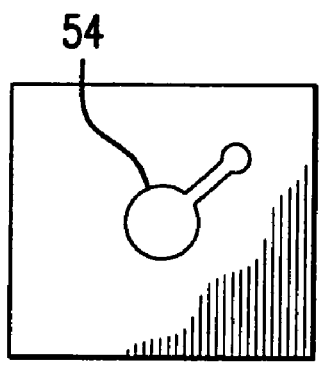
FIG. 4 depicts a top plan view of a chip of FIG. 1 showing an active area of the chip.

Each of the chips 12, 14, 16, 18 may have a number of electrical contacts 24, 26 and electrical traces 28 on a first side that form electrical connections with an active device region 54 (FIG. 4) on a second side of the chips 12, 14, 16, 18. The metal dots 40, 42 are formed on the backside of the wafer 10 and are otherwise substantially not contiguously connected to each other or to any contacts or traces of the active region. At least some of the contacts and traces (e.g., contact 24) may extend outside the area of the chip 12 into a separation zone 25.

Figure 2:
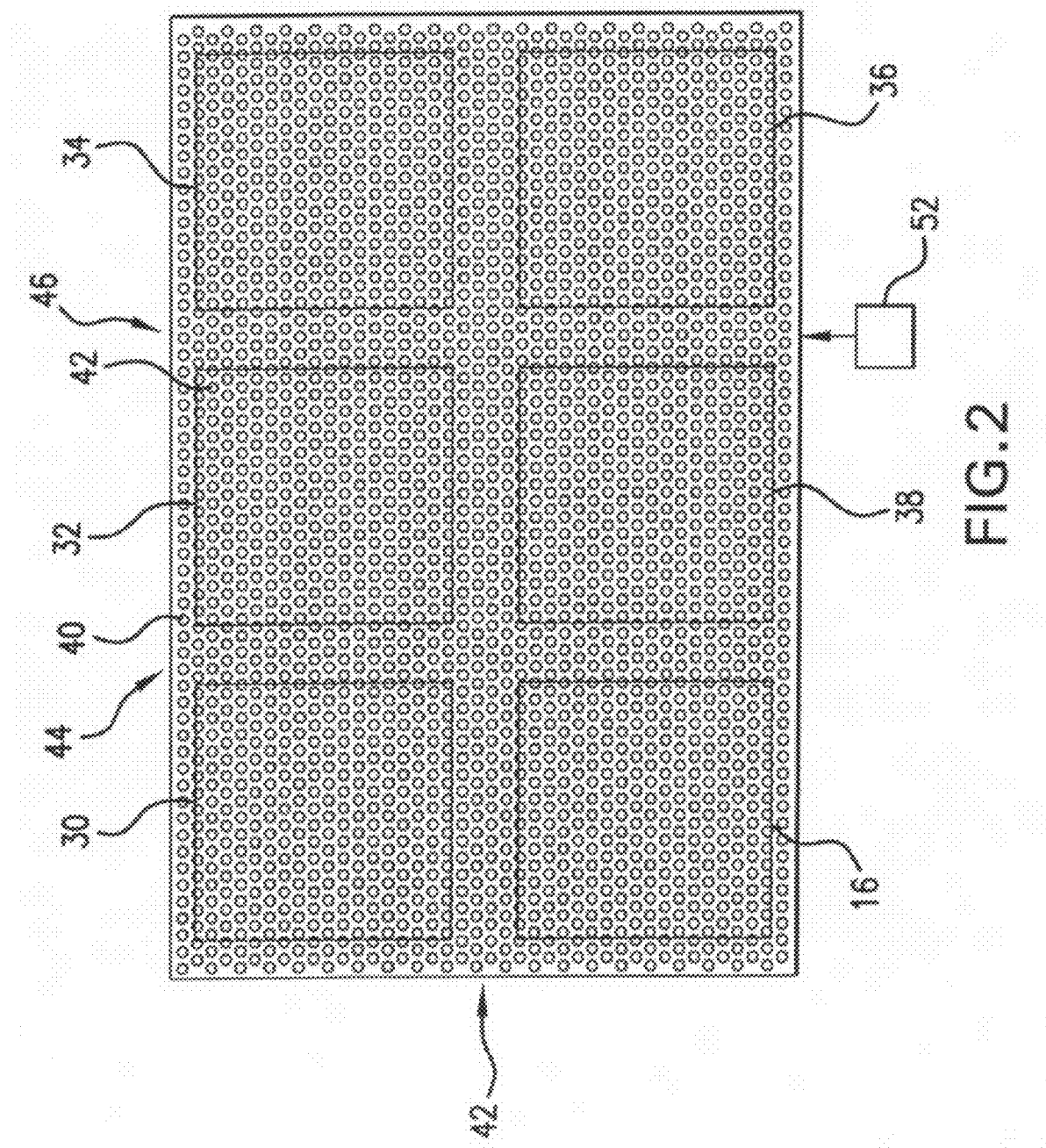
FIG. 2 depicts a portion of the wafer of FIG. 1.

FIG. 2 is a simplified bottom view of a portion 20 of the wafer 10. Portion 20 shows outlines of six integrated circuit chips 16, 30, 32, 34, 36, 38. Shown separating the chips 16, 30, 32, 34, 36, 38 are areas (streets) 42, 44, 46 that will become a saw kerf during dicing.

Shown disposed on the wafer 10 is a number of discrete dots (metal deposits) 40, 42. The metal deposits 40, 42 may be randomly distributed or evenly distributed over the back of the wafer 10. Alternatively, the metal deposits 40, 42 may be grouped on opposing sides of a separation line (i.e., the streets 42, 44, 46). The metal deposits 40, 42 may be formed in any random or geometric shape (e.g., circular, square, elliptical, etc.). As shown in FIG. 2, the metal deposits 40, 42 are formed on the backside of the wafer 10, but are otherwise not contiguously connected to each other or to the contacts 24, 26 or traces 28.

In the embodiment illustrated in FIG. 2, the metal deposits 40, 42 are disposed over the wafer in a two-dimensional array of rows and columns. For example, the metal deposits 40, 42 may be circular in shape, have a diameter of 8 microns and a spacing among metal deposits 40, 42 of 8 microns. A diameter and spacing of 8 microns has been found to work well with a die size of approximately 200 microns on a side. The metal deposits 40, 42 may have a thickness that is substantially equal to the thickness of the contacts 24, 26 and traces 28.

The active regions of the wafer 10 may be formed using conventional processes. The metal deposits 40, 42 (and the contacts 24, 24 and traces 28) may be formed 100 using a single photolithograph and plating process using a mask that has been specially modified to create the specific pattern of metal deposits 40, 42 required.

Figure 3:
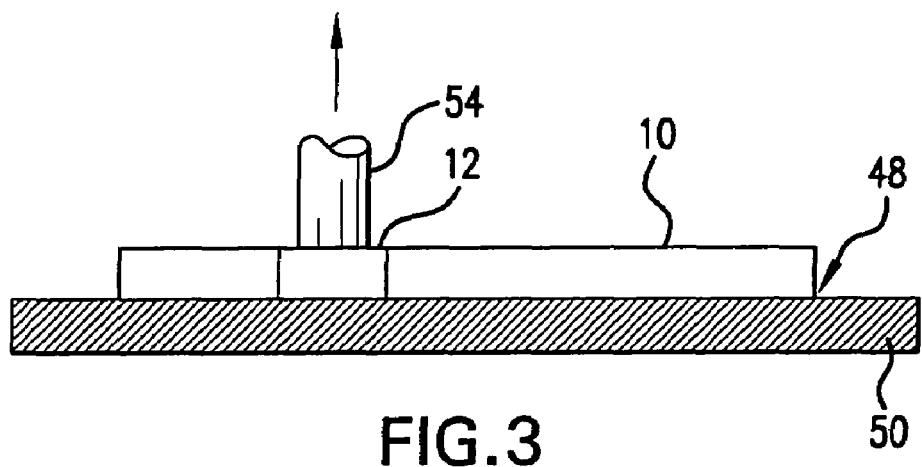
FIG. 3 depicts a section view of the wafer of FIG. 1.

Once the wafer 10 has been processed to impart the intended functionality to the die 12, 14, 16, 18, 30, 32, 34, 36, 38 and the metal deposits 40, 42 have been added, the wafer 10 may be attached to a saw frame 102 for separation into individual die. FIG. 3 shows a cut-away side view of the wafer 10 attached to the plastic adhesive film 50 of a saw frame. The metal deposits 40, 42, the contacts 24, 26 and traces 28 form a thin (discontinuous) layer 48 that provides a first level of engagement between the wafer 10 and the adhesive film 50.

In use, the metal deposits 40, 42 along with the contacts 24, 26 and traces 28 form a first point of contact when the wafer 10 is attached to the adhesive 50. The presence of the metal deposits 40, 42 increases the overall area of that first point of contact by several orders of magnitude.

Without the metal deposits 40, 42, the attachment of the wafer 10 to the adhesive layer 50 required that the unmetalized lower surface of the wafer 10 be brought into intimate contact with the adhesive layer 50. In prior art wafers, this has caused the raised contacts 24, 26 and traces 28 to be driven into the adhesive and plastic structure of the adhesive layer 50. Penetration into the adhesive layer 50 caused the contacts 24, 26 and traces 28 to be held much more tightly with a stronger bond than the wafer 10 itself. The result is that any metal of the bonds 24, 26 or traces 28 that has already been loosened by sawing or cleaving is more easily torn loose during the separation process.

In the example above, with metal dots 40, 42 of 8 microns diameter and 8 microns of separation between dots 40, 42, the metal dots 40, 42 occupy approximately 19.5W of the area of the bottom of the wafer 10. The metal contacts 24, 24 and traces 28 may equal or exceed the area of the dots 40, 42.

During a subsequent separation process, the streets 42, 44, 46 may be removed 104 by a dicing saw 52 in a dicing operation. However, a much smaller portion of the contacts 24, 26 and traces 28 lie in the streets 42, 44, 46. Since a much smaller portion of the contacts 24, 26 and traces 28 lie in the streets 42, 44, 46, the dicing operation results in a greater portion of the area of the die that is held to the adhesive layer 50 via the metal deposits 40, 42, contacts 24, 26 and traces 28.

In general, the presence of the metal dots 40, 42 reduces the average pulling forces on the contacts 24, 26 and traces 28 by increasing the overall surface area which preferentially bonds to the adhesive layer 50. The result is a significant reduction in the occurrence of burrs during the separation process. Separation of the die from the adhesive layer may occur using a pick and place tool 54. In this regard, the pick and place tool 54 may contact a top surface of the die 12, apply a vacuum to the pick and place tool 54 and lift 106 the die 12 off the adhesive 50 and out of the sawn wafer 10.

Not only does the presence of the metal dots 40, 42 reduce the incidence of burrs, but the dots 40, 42 also reduce the incidence of delamination caused by other manufacturing defects (plating flaws). The result is an overall decrease in the defect rate of chips processed using the presence of the novel metal deposits 40, 42.

A specific embodiment of novel apparatus for protecting metal traces and contacts on a fabricated semiconductor wafer according to the present invention have been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention, any and all modifications, variations, or equivalents that fall within the true spirit and scope of the basic underlying principles disclosed and claimed herein.

The invention claimed is:

1. A semiconductor wafer comprising:
   an active device on a first side of the wafer;
   a backside contact disposed on a second side of the wafer; and
   a group of discrete deposits disposed on the second side of the wafer, wherein said discrete deposits are substantially not contiguously connected to each other and protect the backside contact from mechanical damage during dicing of the semiconductor wafer into a plurality of die.

2. The semiconductor wafer as in claim 1 wherein the discrete deposits further comprise metal.

3. The semiconductor wafer as in claim 1 further comprising the discrete deposits grouped around the protected metal traces and contacts.

4. The semiconductor wafer as in claim 1 further comprising the discrete deposits grouped on opposing sides of a separation line of the die.

5. The semiconductor wafer as in claim 1 further comprising the discrete deposits distributed over an area of each die.

6. The semiconductor wafer as in claim 1 further comprising a pattern of discrete deposits.

7. The semiconductor wafer as in claim 1 further comprising a two-dimensional array of discrete deposits.

8. The semiconductor wafer as in claim 1 further comprising a number of discrete deposits over each die such that an aggregate area of the group of discrete deposits is no more than 20% of a total area of each die.

9. The semiconductor wafer as in claim 1 wherein the discrete deposits further comprise circular shapes.

10. The semiconductor wafer as in claim 1 wherein the discrete deposits further comprise a diameter substantially equal to 8 microns.

11. The semiconductor wafer as in claim 10 further comprising a spacing between the circular discrete deposits of approximately 8 microns.

12. A semiconductor wafer comprising:
a plurality of active devices formed on a first side of the wafer;
a backside contact of each of the respective plurality of active devices disposed on a second side of the semiconductor wafer; and
a group of discrete deposits disposed on the wafer adjacent the backside contacts, wherein said discrete deposits are substantially not contiguously connected to each other or to any contacts of the active devices and where the group of discrete metal deposits protect the backside contacts of the active devices from mechanical damage during dicing of the semiconductor wafer into a plurality of die.

* * * * *